(12) United States Patent
Alpert et al.

(10) Patent No.: US 7,882,475 B2
(45) Date of Patent: Feb. 1, 2011

(54) METHOD TO REDUCE THE WIRELENGTH OF ANALYTICAL PLACEMENT TECHNIQUES BY MODULATION OF SPREADING FORCES VECTORS

(75) Inventors: Charles J. Alpert, Cedar Park, TX (US); Gi-Joon Nam, Austin, TX (US); Haoxing Ren, Austin, TX (US); Paul G. Villarrubia, Austin, TX (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 360 days.

(21) Appl. No.: 12/181,447

(22) Filed: Jul. 29, 2008

(65) Prior Publication Data

US 2008/0282213 A1 Nov. 13, 2008

Related U.S. Application Data

(63) Continuation-in-part of application No. 11/531,322, filed on Sep. 13, 2006, now abandoned.

(51) Int. Cl.
*G06F 17/50* (2006.01)
*G06F 9/45* (2006.01)
(52) U.S. Cl. .................. 716/8; 716/9; 716/10; 716/11; 716/12
(58) Field of Classification Search ................ 716/8–12
See application file for complete search history.

(56) References Cited

U.S. PATENT DOCUMENTS 7,266,796 B1 * 9/2007 Chu et al. ...................... 716/9
7,284,220 B1 * 10/2007 Johnson ......................... 716/9

OTHER PUBLICATIONS

Kur et al., Force Directed Mongrel with Physical Net Constraints, ACM, Jun. 2-6, 2003, pp. 214-219.

* cited by examiner

*Primary Examiner*—Nghia M Doan
(74) *Attorney, Agent, or Firm*—Cantor Colburn LLP; Libby Toub

(57) ABSTRACT

A method of force directed placement programming is presented. The method includes: assigning a plurality of objects from a cell netlist to bins; shifting the objects based on the bins; computing a magnitude of a spreading force for each object of the plurality of objects based on the shifting; sorting the objects based on the magnitude of the spreading force of the objects; selecting a subset of the sorted objects based on a threshold value indicating at least one of a top percentage, a threshold force, and a threshold value that is based on a placement congestion; adjusting the spreading force of the selected objects to be equal to a predetermined value indicating a minimum spreading force; and determining a placement of the objects based on adjusted spreading force of the selected objects.

3 Claims, 4 Drawing Sheets

METHOD TO REDUCE THE WIRELENGTH OF ANALYTICAL PLACEMENT TECHNIQUES BY MODULATION OF SPREADING FORCES VECTORS

RELATED APPLICATIONS

This application is a continuation-in-part of pending U.S. patent application Ser. No. 11/531,322 filed Sep. 13, 2006, the contents of which is incorporated herein by reference in its entirety.

FIELD OF THE INVENTION

This invention relates to placement for very large circuits, and particularly to a method to reduce the wirelength of analytical placement techniques by modulation of spreading force vectors.

DESCRIPTION OF BACKGROUND

In electronic design automation, placement assignment, i.e., the assignment of exact locations for various circuit components within a chip's core area, is important. Placement assignment affects the chip's performance and may also result in a design with excessive wirelength, which is beyond available routing resources. Accordingly, placement assignment seeks to optimize a number of objectives to ensure that a circuit meets its performance demands. One of the typical placement objectives includes minimizing the total wirelength, or the sum of the length of all the wires in the design. This not only helps minimize chip size and cost, but also minimizes power and delay, which are proportional to the wirelength and wirelength squared, respectively.

Placement assignment is particularly important in application-specific integrated circuits, or ASICs, and in gate array structures such as field-programmable gate arrays (FPGAs).

Analytical placement techniques are used to minimize wirelength. Analytical placement techniques typically optimize a quadratic wirelength objective or an approximation of the linear wirelength objective. A major concern with analytical placement techniques is that the solution of the non-linear program results in a placement with a lot of overlap among the objects. As a result, the objects have to be spread around the placement area to resolve the overlaps amongst themselves and result in a legal, non-overlapping placement. Hence, analytical placement techniques follow an iterative procedure in which they alternate between a non-linear program solve step and a spreading step, to simultaneously minimize the wirelength and spread the objects around the placement area. Before our invention, the iterative procedure of solving the non-linear program followed by the spreading step often resulted in a placement with a high wirelength.

SUMMARY OF THE INVENTION

The shortcomings of the prior art are overcome and additional advantages are provided through the provision of a method of force directed placement programming. A method of force directed placement programming is presented. The method includes: assigning a plurality of objects from a cell netlist to bins; shifting the objects based on the bins; computing a magnitude of a spreading force for each object of the plurality of objects based on the shifting; sorting the objects based on the magnitude of the spreading force of the objects; selecting a subset of the sorted objects based on a threshold value indicating at least one of a top percentage, a threshold force, and a threshold value that is based on a placement congestion; adjusting the spreading force of the selected objects to be equal to a predetermined value indicating a minimum spreading force; and determining a placement of the objects based on adjusted spreading force of the selected objects.

System and computer program products corresponding to the above-summarized methods are also described and claimed herein.

Additional features and advantages are realized through the techniques of the present invention. Other embodiments and aspects of the invention are described in detail herein and are considered a part of the claimed invention. For a better understanding of the invention with advantages and features, refer to the description and to the drawings.

As a result of the summarized invention, technically we have achieved a solution, which enhances the force directed placement programming to simultaneously spread the objects and minimize the wirelength. This will not only help minimize chip size and cost, but also minimizes power and delay, which are proportional to the wirelength and wirelength squared, respectively.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which.

The detailed description explains the preferred embodiments of the invention, together with advantages and features, by way of example with reference to the drawings.

DETAILED DESCRIPTION OF THE INVENTION

Figure 1:
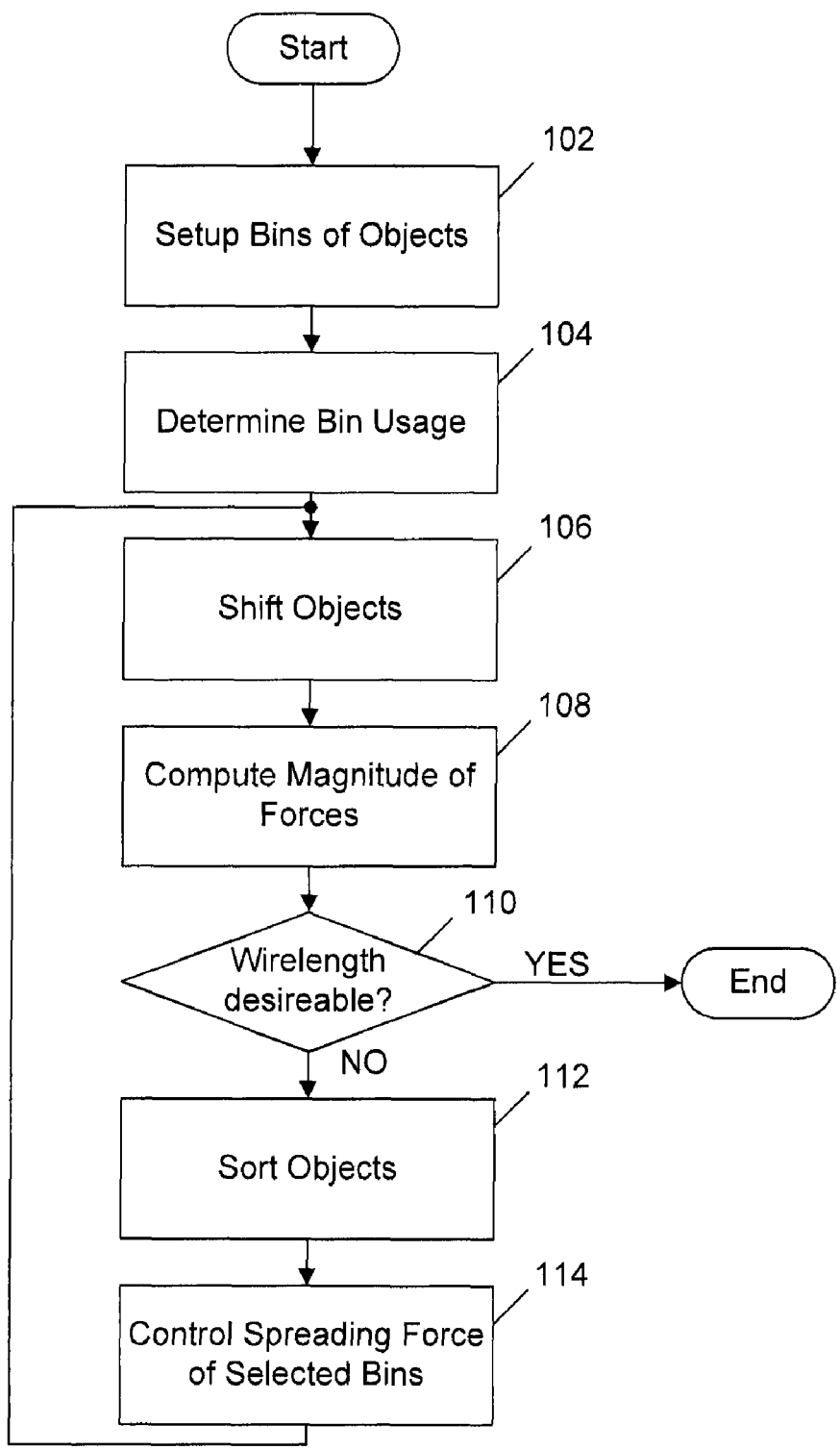
FIG. 1 is a flowchart illustrating a placement method in accordance with an exemplary embodiment.

An analytical placement technique that seeks to have objects (or cells) of a chip spread around a placement area to resolve the overlaps amongst themselves and result in a legal, non-overlapping placement is presented. A variety of techniques like Diffusion, Cell-Shifting, and others can be used for this spreading. In one example, as shown in FIG. 1, these techniques bin the placement area as shown in block 102 and determine the utilization of each bin at block 104. The utilization of a bin is defined as the total area of all the objects within the bin. This gives a measure of the current placement congestion. The objects are then shifted around the placement area based on their respective bins and its utilization at block 106. Spreading techniques employed during analytical placement try to maintain the relative positions (or ordering) of the objects that were obtained after the initial non-linear program solve step.

Spreading techniques only give a target position for an object based on the placement utilization in and around the bin of the object. To move the object from its current location to its target location, additional forces are added to the object. These additional forces account for the spreading during the subsequent non-linear program solve step. The magnitudes of these additional forces are proportional to the distance between the position of the object before and after the spreading step.

For each object, a native force is a force on the object due to its connections with other objects in a netlist, and a spreading force is an additional force added to the object to guide it around the placement area.

During analytical placement, at any instant, an object is acted upon by two forces, i.e., the native force that tries to bring the object closer to the other objects connected to it, and the spreading force that tries to push it away from the other objects so as to resolve overlaps. Such analytical placement techniques are known as Force Directed Placement (FDP) techniques or program and are performed at blocks 108-110. For example, the magnitude of the forces upon shifting is computed at block 108 and the wirelength is evaluated at block 110.

Upon evaluation of the wirelength, the spreading forces can be further controlled at blocks 110-114. For example, if the wirelength is not desirable (e.g., within a predetermined range) at block 110, the objects are sorted into bins at block 112. The spreading force of selected bins are controlled at block 114. Thereafter, the method loops back and continues with shifting the objects at block 106 and computing the magnitude of the forces at block 108 until a desirable wirelength is achieved at block 110. Thereafter, the method may end.

During FDP, a careful balance between the native and spreading forces is desired to spread the objects over the placement area while simultaneously minimizing the wirelength. If the magnitudes of the spreading forces are too large, the objects will be spread farther apart from each other, resulting in a placement with a very high wirelength. On the other hand, if the native forces dominate, the placement will be highly congested with a lot of overlap among the objects. More specifically, the FDP bins the placement area and determines the utilization of each bin. The utilization of a bin is defined as the total area of all the objects within that bin. This gives a measure of the current placement congestion. The objects are then shifted around the placement region based on their respective bins and its utilization. Such spreading techniques try to maintain the relative positions (or ordering) of the objects that were obtained after the initial quadratic program (QP) solve step. Also, spreading techniques only give a target position for an object. To actually move the object from its current location to its target location, additional forces need to be added to the object. These additional forces account for the spreading during the subsequent QP solve step and their magnitude is proportional to the distance moved by the object during spreading. The native force is due to the object's connections with the other objects in the netlist. The spreading force guides the object around the placement region.

Figure 2:
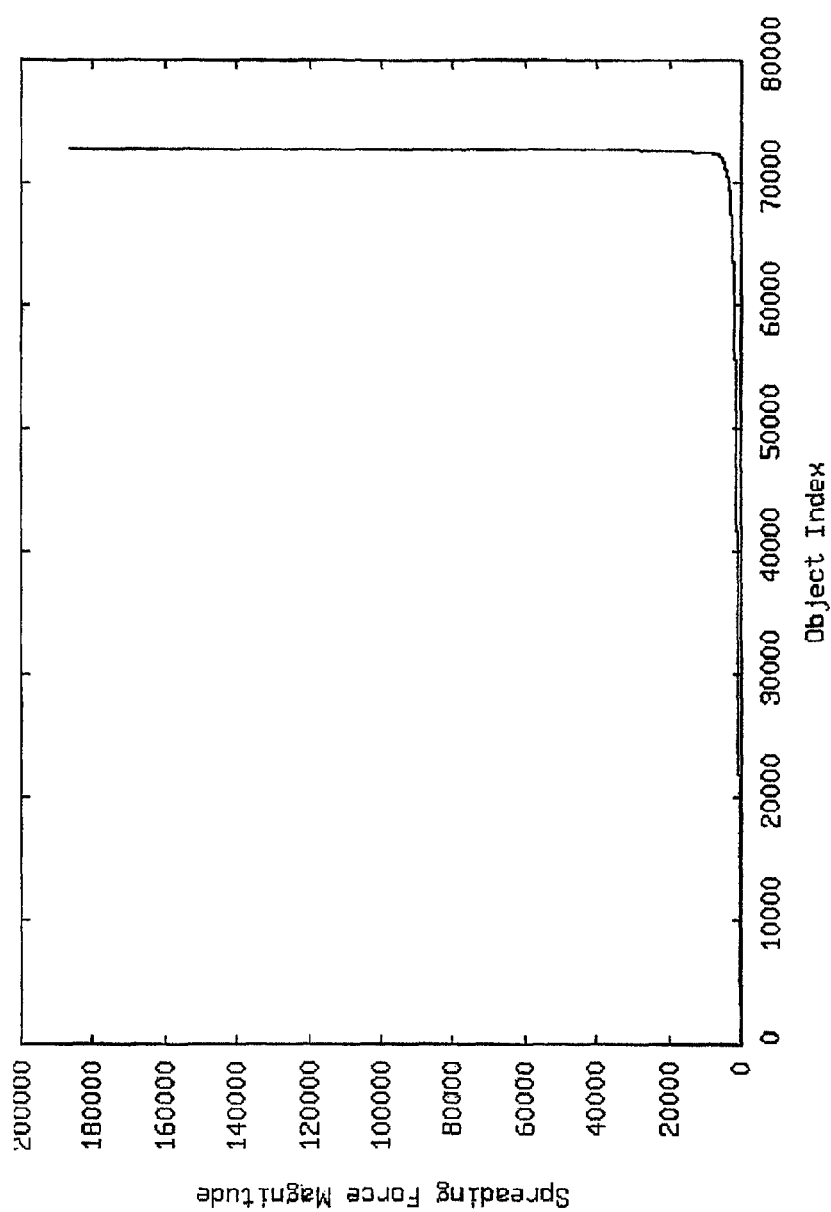

With continued reference to FIG. 1 and turning now to FIG. 2, a plot of the magnitude of the spreading force for all the objects during one of the iterations of FDP is shown. From the plot it is seen that a few objects had an extremely high spreading force magnitude. It was experimentally observed that retaining the full spreading force magnitude for these objects resulted in a placement with a very high wirelength.

The magnitude of the spreading force for the fraction of the placeable objects that have a very high spreading force magnitude is to be controlled at blocks 112-114. By controlling the spreading force magnitude for these objects, the wirelength of the placement is substantially reduced, without sacrificing the degree of spreading. The method therefore, proposes to modulate the spreading force vectors within FDP. Modulation of spreading forces results in a modified distribution of the spreading force magnitudes. In the limit, modulation can also result in the total nullification of the spreading force for a certain fraction of the objects.

Figure 3:
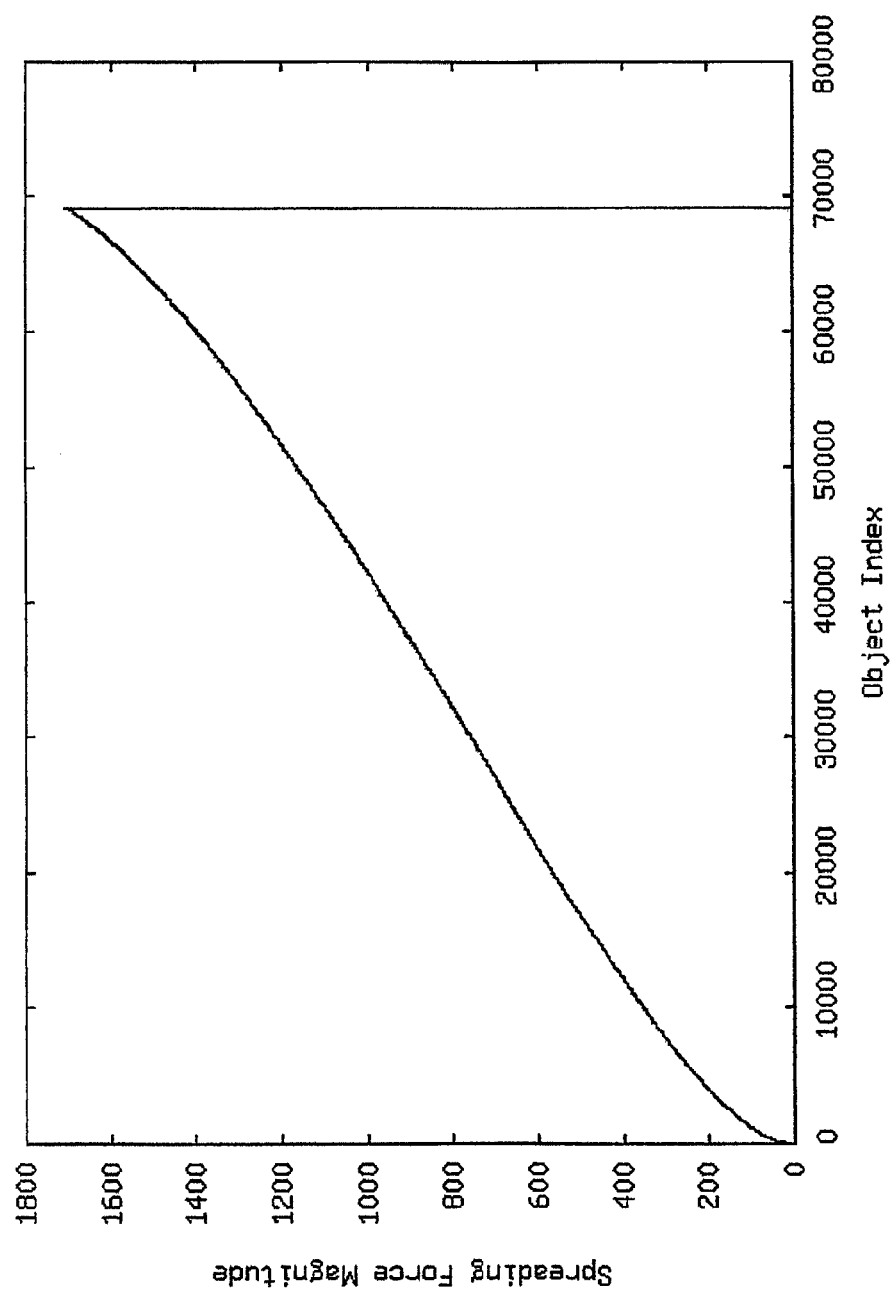
FIGS. 3-4 are plots of the magnitude of the spreading force for all the objects during one of the iterations of force directed placement.

In this exemplary method, objects of a netlist for a chip are sorted in ascending order of the magnitude of their spreading force at block 112 during each iteration of FDP and the top x % of the objects are selected. For the selected objects the spreading force for the subsequent non-linear solver step of the analytical placement is waived (or nullified) at block 114. About 5% to about 10% (i.e., x %) of the total number of placeable objects are selected for this waiver. Turning to FIG. 3 and with continued reference to FIG. 1, a plot of the magnitude of the spreading force for all the objects during one of the iterations of FDP after nullifying x % of the objects, is shown.

Another method of modulation proposed is to pick a certain fraction of the objects based on the magnitude of the spreading force at block 112 and schedule the magnitude of the spreading force for the selected objects instead of totally nullifying them at block 114. This scheduling can be based on the current placement congestion.

Figure 4:
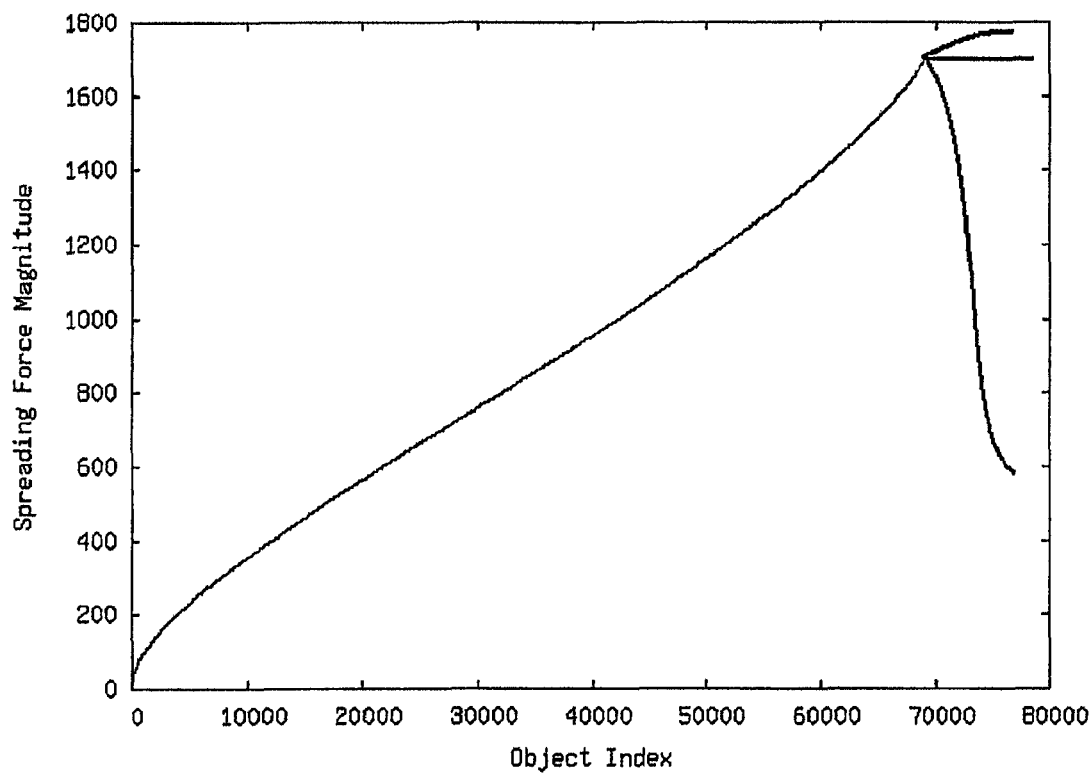

Yet another method for modulation is to schedule the number of objects (i.e., x) to be modulated over iterations of FDP at block 112. In other words, vary the fraction of the objects to be modulated over iterations of FDP, based on a certain metric like the placement congestion. Turning to FIG. 4, a plot of the magnitude of the spreading force for all the objects during one of the iterations of FDP where a fraction of the objects are modulated based on placement congestion, is shown. By modulating the spreading force on a certain fraction of the total number of placeable objects, the native force acting on them is emphasized emphasized. As a result, the positions of these objects after the subsequent solver step will be based only on their connections to the other objects in the netlist. This is equivalent to optimizing the wirelength objective with no contraints on these objects. As a result these objects will be placed in their quadratically optimal positions.

By modulating the spreading force on these selected objects, the native force acting on them is emphasized. As a result, the positions of these objects after the subsequent solver step are based only on their connections to the other objects in the netlist. Resulting in optimizing the wirelength objective at block 110 without constraints on these objects. Since only x % of the total number of placeable objects are selected for modulation, the objects that are not modulated still shift towards their target positions (determined during the spreading step) and contribute towards spreading the placement. Whereas the modulated objects are shifted to positions that are solely based on minimizing the wirelength objective resulting in a placement with better wirelength and timing. As a result of this modulation, objects no longer retain their relative ordering as obtained during the initial non-linear program solve step. This change in the relative positions or orderings of objects is the reason for the significant decrease in the final global placement wirelength. Experimental results show that the present method of modulating selected objects in the FDP iterations further enhances the FDP to simultaneously spread the objects and minimize the wirelength. On average a two times decrease in the wirelength and on some circuits up to a three times reduction in the wirelength after FDP were observed.

The capabilities of the present invention can be implemented in software, firmware, hardware or some combination thereof.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention. The article of manufacture can be included as a part of a computer system or sold separately.

Additionally, at least one program storage device readable by a machine, tangibly embodying at least one program of instructions executable by the machine to perform the capabilities of the present invention can be provided.

There may be many variations to the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

We claim:

1. A method of force directed placement, the method comprising:

assigning a plurality of objects from a cell netlist to bins;

shifting the objects based on the bins;

computing, by a computer, a magnitude of a spreading force for each object of the plurality of objects based on the shifting;

sorting, by the computer, the objects based on the magnitude of the spreading force of the objects;

selecting, by the computer, a subset of the sorted objects based on a threshold value indicating at least one of a top percentage, a threshold force, and a threshold value that is based on a placement congestion;

adjusting, by the computer, the spreading force of the selected objects to be equal to a predetermined value indicating a minimum spreading force; and determining, by the computer, a placement of the objects based on adjusted spreading force of the selected objects.

2. The method of claim 1 wherein the sorting the objects comprises sorting the objects in an ascending order based on the magnitude of the spreading force.

3. The method of claim 1 further comprising providing the predetermined value as at least one of zero and null.

* * * * *